United States Patent [19]

Silver

[11] Patent Number: 4,879,488

[45] Date of Patent: Nov. 7, 1989

[54] VERNIER FOR SUPERCONDUCTING ANALOG-TO-DIGITAL CONVERTER

[75] Inventor: Arnold H. Silver, Rancho Palos Verdes, Calif.

[73] Assignee: TRW Inc., Redondo Beach, Calif.

[21] Appl. No.: 190,965

[22] Filed: May 6, 1988

[51] Int. Cl.[4] .............................................. H03M 1/00
[52] U.S. Cl. .................................... 341/171; 341/133; 505/827
[58] Field of Search ................. 341/133, 171; 505/827

[56] References Cited

U.S. PATENT DOCUMENTS

| 4,315,255 | 2/1982 | Harris et al. | 341/171 |
| 4,646,060 | 2/1987 | Phillips et al. | 341/171 |
| 4,672,359 | 6/1987 | Silver | 341/133 |

FOREIGN PATENT DOCUMENTS 0067321  4/1986  Japan ................................. 341/133

Primary Examiner—William M. Shoop, Jr.
Assistant Examiner—Helen Kim
Attorney, Agent, or Firm—Noel F. Heal; Sol L. Goldstein

[57] ABSTRACT

An analog-to-digital converter employing superconducting quantum interference devices (SQUID's) to produce countable voltage pulses at uniformly spaced quantization levels, the converter having multiple SQUID quantizers, each of which receives an identical analog signal current to be converter to digital form, and a bias current to provide an offset in the position of the quantization level for each quantizer. For a quantization current of $\Delta i$, the bias currents in each of $2^n$ quantizers are 0, $\Delta i/2^n$, $2\Delta i/2^n$, and so forth up to $(2^n-)\Delta i/2^n$. The outputs of the quantizers are monitored in associated flip-flop circuits, the states of which are sampled and decoded to yield an n-bit output that can be combined with the output of a binary counter monitoring just one of the quantizers. The quantizers provide outputs that are effectively interleaved between adjacent quantization levels of a single quantizer. This arrangement of multiple quantizers can be employed to increase the sampling rate or the resolution of the converter, without needing any improvement in the basic response time of the quantizers.

14 Claims, 5 Drawing Sheets

VERNIER FOR SUPERCONDUCTING ANALOG-TO-DIGITAL CONVERTER

BACKGROUND OF THE INVENTION

This invention relates generally to high-performance analog-to-digital (A/D) converters and, more particularly, to superconducting A/D's, employing superconducting Josephson junction devices. There is a requirement for high-performance A/D conversion equipment in both military and commercial applications. Two important measures of A/D converter performance are speed, i.e. the sampling rate in samples converted per second, and resolution, as measured by the ratio of the largest to the smallest increment of change that can be detected in an analog signal. Resolution is sometimes referred to as the dynamic range. Many applications require both high sampling rates and high resolution. Other important measures of A/D converter performance are sensitivity and linearity. Conventional techniques employing semiconductor circuitry have not been able to satisfy this requirement.

A/D conversion using Josephson junctions has been described in the technical literature. John P. Hurrell et al. described one such technique in a paper entitled "Analog-to-Digital Conversion with Unlatched SQUID's," published in the IEEE Transactions on Electron Devices, Vol. ED-27, No. 10, pp. 1887–96 (October 1980). SQUID is an acronym for Superconducting Quantum Interference Device.

The theory of operation of SQUID's for use in A/D conversion is explained in detail in the Hurrell et al. paper, and only a simplified explanation will be provided here by way of background. Similarly, the theory of operation of Josephson junctions is now widely known, and has been the subject of discussion in many technical papers. For example, see B. D. Josephson, "Supercurrents through Barriers," Advan. Phys., Vol. 14, pp. 419–51 (1965), and other papers cited in the Hurrell et al. paper.

A Josephson junction has a current-voltage characteristic that includes a region in which the current increases rapidly from zero, with no corresponding increase in voltage across the device. A SQUID is a circuit including one or more Josephson junctions and one or more inductive loads. A single-junction SQUID includes a Josephson junction connected across an inductance. If a current is injected into one end of the inductance and the other end is grounded, the resulting characteristics provide the basis for A/D conversion, as explained in detail in the Hurrell et al. paper. Similar characteristics pertain to the two-junction SQUID, and in fact to n-junction SQUIDs.

The most pertinent property of the SQUID, from the standpoint of A/D conversion, is to be found in the relationship between the magnetic flux in the SQUID and the value of the injected current. This flux-current relationship is a periodic function and, depending on the circuit parameters chosen, a multi-valued function. The most significant aspect of the relationship is that the flux changes by a small quantum whenever the current increases by a small and precisely repeatable increment. This quantum of flux gives rise to a small but measurable voltage pulse across one junction. When the current is decreased, a flux quantum of opposite polarity is produced for each precise decrement of current, and a corresponding voltage pulse of opposite polarity is produced across a junction.

This property of the SQUID forms the basis for the A/D converter described in the Hurrell et al. paper. A signal to be converted from analog to digital form is introduced into the SQUID as a varying current in the inductor. Each time the current increases or decreases by a predetermined increment, a measurable voltage pulse is generated across the junction. In this manner, the SQUID functions as a quantizer. The resultant pulses are then detected and counted in one or more counters. The principal advantages of the arrangement are: (1) its near perfect linearity, (2) its sensitivity, and (3) its large dynamic range. The current increment, which determines the sensitivity, can be extremely small. The flux quantum is only $2.02 \times 10^{-15}$ weber and the current increment is given by this value divided by the load inductance (measured in henries).

A double-junction SQUID comprises two Josephson junctions and a center-tapped inductance. The end terminals of the inductance are connected to a terminal of each of the junctions, and the other terminals of the junctions are connected together to ground. A control current is injected across the inductance, and a gate current is injected at the center tap of the inductance.

The double-junction SQUID circuit is bistable if the currents are appropriately chosen and controlled. Basically, in each of its two stable states the circuit has a circulating current component that flows through both of the junctions and the inductance. The direction of the circulating current component determines which state the circuit is in. When the gate current is raised momentarily above a threshold level, one of the junctions generates a voltage pulse and the direction of the circulating current reverses Subsequent pulses applied to the gate current toggle or reverse the state of the SQUID. Multiple circuits working on this principle can be connected in a cascade arrangement to operate as a binary scaler, counting the number of pulses from the quantizer.

A/D converters employing SQUID's have been disclosed in a number of patents, including U.S. Pat. Nos. 3,949,395 to Klein, 4,646,060 to Phillips et al. and 4,672,359 to Silver. Inherently, all high-performance A/D converters are limited by their resolution and their sampling rate. A measure of comparison that is sometimes used is the product of the resolution and the sampling rate. The sampling rate limitation of a SQUID quantizer is due to an inherent limit in the pulse rate that a SQUID can generate. The single flux quantum (SFQ) response time of the quantizer depends principally on the junction parameters. For example, the SFQ response time to achieve a 9-bit resolution at a sampling rate of 1.5 gigasamples per second (GSps), is approximately 1 picosecond (ps). The response time limits either the sampling rate or the resolution. If greater resolution is required, the quantizer will have to count more pulses per second, but this pulse rate is limited by the SFQ response time. Once the response time limit is reached, the resolution can be increased only at the expense of the sampling rate, and vice versa.

The present invention provides a solution to this apparently impenetrable barrier to increased sampling rate and resolution of a SQUID A/D converter.

SUMMARY OF THE INVENTION

The present invention resides in a superconducting analog-to-digital converter in which multiple quantizers are employed to provide interpolation between adjacent quantization levels of a single quantizer. The multiple quantizers provide a selected number of low-order bits of significance in the digital output, and can, be employed to increase the resolution of the converter, or, to increase the sampling rate, without the need for an inherently faster switching response time in the quantizers.

Briefly, and in general terms, the A/D converter of the invention comprises a plurality of quantizers in the form of superconducting quantum interference devices (SQUID's), configured to generate voltage pulses at periodically spaced quantization levels of an analog signal current applied to the quantizers; means for applying an identical analog signal current to each of the plurality of quantizers; means for applying a different bias current to each of the plurality of quantizers, such that the quantization levels are offset from each other in a uniform manner to provide for interpolation between adjacent quantization levels of a single quantizer; and means for monitoring the voltage pulses output by the quantizers to determine the digital equivalents of changes in the analog signal current. The differently biased quantizers provide a set of quantization levels interleaved between two adjacent quantization levels of a single quantizer.

The means for monitoring the voltage pulses typically includes at least one binary counter. Two such counters are presently preferred, to ensure that no counts are lost while one counter is being unloaded.

More specifically, the number of quantizers is $2^n$, and the means for monitoring the voltage pulses includes an N-bit bidirectional binary counter for counting pulses from one of the quantizers, and decoding means coupled to receive inputs from the quantizers, to generate n-bit output signals indicative of the analog signal current level in relation to the biased quantization levels of the plurality of quantizers. The converter provides an (N+n)-bit digital output equivalent to the accumulated change in the analog input signal. The conceptually simplest approach for decoding this converter output is to couple each of the quantizers to a binary counter and then to digitally add the binary signals from all of the counters.

In the illustrative embodiment of the invention, each of the quantizers has an associated divide-by-two circuit to provide an indication of a binary state of the quantizer. The converter also includes clocking means to control reading of binary signals from the divide-by-two circuits.

The decoding means of the illustrative embodiment includes a plurality of exclusive OR gates coupled to receive as inputs the states of the divide-by-two circuits associated with the quantizers, and to provide $2^n$ outputs that uniquely identify which of $2^n$ states are represented by the binary quantization states of the quantizers. The decoding means further includes logic means for converting the $2^n$ output of the exclusive OR gates to an n-bit binary output signal.

The key to providing an interleaver or vernier type of operation of the converter is the manner in which the multiple quantizers are biased to offset their quantization levels. If the vernier is to provide an n-bit output, $2^n$ quantizers are needed. If the quantization current of a single quantizer is $\Delta i$, the bias currents in each of $2^n$ quantizers are 0, $\Delta i/2^n$, $2\Delta i/2^n$, and so forth up to $(2^n-1)\Delta i/2^n$.

It will be appreciated from the foregoing that the present invention represents a significant advance in the field of superconducting A/D converters. In particular, the invention provides either increased resolution or increased sampling rate, or both, without requiring any improvement in the basic switching response time of the quantizers employed. Other aspects and advantages of the invention will become apparent from the following more detailed description, taken in conjunction with the accompanying drawings.

BRIEF DESCRIPTION OF THE DRAWINGS

FIG. 2b is a graph showing a set of threshold response curves for the SQUID of FIG. 2a;

DESCRIPTION OF THE PREFERRED EMBODIMENT

Figure 1:
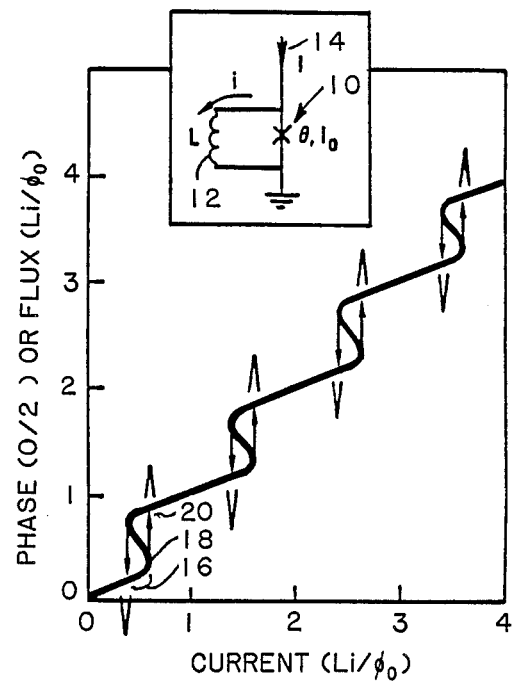
FIG. 1 is a graph showing the nonlinear magnetic flux-current response of a single-junction SQUID.

As shown in the drawings for purposes of illustration, the present invention is concerned with high-performance analog-to-digital (A/D) converters employing Josephson junctions connected to form superconducting quantum interference devices (SQUID's). A/D converters fall into a number of general categories, two of which will be discussed by way of further background.

A common type of A/D converter is the fully parallel "flash" converter, having a large number of matched comparators that simultaneously compare an analog input signal with an entire range of values corresponding to discrete digital steps in the range of the device. This generates a thermometer code that is decoded to provide a digital output corresponding the analog signal. For an N-bit converter, the flash converter needs $2^N$ of $2^N-1$ comparators, but takes only a single clock cycle to perform a conversion.

Another A/D converter category is that of the counter type of converter. In general, the counting type of A/D converter employs a selected physical phenomenon to convert an analog input signal to a series of pulses that can be counted. Some counting converters use a voltage-to-frequency conversion scheme. The SQUID type of converter uses an incremental binary counting scheme in which, ideally, perfectly periodic quantization levels are established over the entire dynamic range of interest. That is to say, a quantization current increment of $\Delta i$ will cause a countable pulse over the entire range. In a sense, the present invention is analogous to a combination of the counter type of A/D converter and the parallel type of converter. The counter approach is used to provide a conversion of higher-order bits of significance, while multiple quantizers are used to provide a selected number of lower-order bits of significance. The following discussion first summarizes operation of the basic SQUID quantizer; then introduces the novel aspects of the present invention.

The insert contained within FIG. 1 shows a simple single-junction SQUID, comprising a Josephson junction device, indicated by reference numeral 10, connected across a load inductance 12. One terminal of the load inductance is grounded and the other terminal is connected to a current source, indicated at 14. The graph of FIG. 1 is a simplified representation of the relationship between the injected current and the magnetic flux linking the device 10 and the inductance 12. It will be seen that, as the current increases, the flux also increases, until a multi-valued region of the curve is reached, as indicated at 16. When a current reversal point 18 is reached, further increase in the current causes the current to jump to a higher level on the curve, as indicated at 20. This sudden flux increase results in a small but measurable voltage pulse across the junction 10. The curve of FIG. 1 is perfectly periodic In other words, the current increments between successive peaks in the curve are uniform, as are the flux increments that are generated as a result of the current increments. This, then, is the basis of the A/D converter using superconducting devices When the current through the circuit falls, increments of flux in the opposite sense are generated, and corresponding voltage pulses are generated across the junction 10.

Figure 2A:
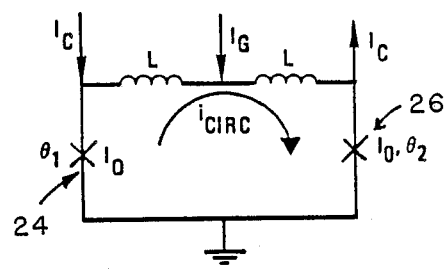
FIG. 2a is schematic diagram of a symmetric double-junction SQUID.

For a number of reasons, double-junction SQUID's are typically employed in superconducting A/D converters. FIG. 2a is a schematic diagram for a double-junction SQUID, including two Josephson junctions 24, 26, and a center-tapped inductance 28 connected between the two junctions. One terminal of each of the junctions 24, 26 is connected to ground, to form a circuit loop comprising the inductance and the junctions, through which a current $i_{CIRC}$ circulates. A gate current $I_G$ is injected at the center tap of the inductance 28, and an analog signal current to be measured, $I_C$ is passed through the inductance. The analog signal current $I_C$, is typically injected into the inductance 28 by means of transformer coupling through an external winding (not shown).

The theory of operation of the bi-stable SQUID is discussed in the technical literature and in U.S. Pat. No. 4,646,060. From the standpoint of the present invention, one need only understand that the circuit will act as a quantizer and will produce voltage pulses across one of the junctions as the analog current $I_C$ increases, and voltage pulses across the other junction as the current $I_C$ decreases. These two trains of pulses can be fed to two separate counters, or a bidirectional counter can be used, as disclosed in U.S. Pat. No. 4,646,060.

Figure 2B:
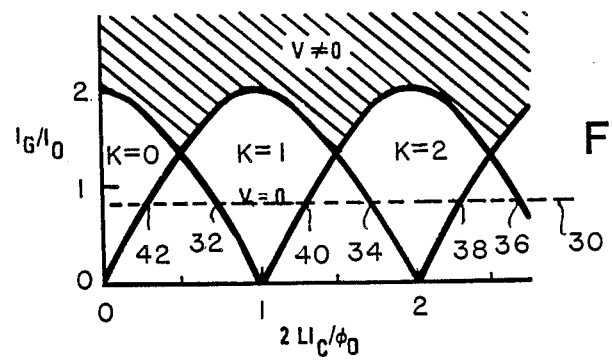

FIG. 2b shows a set of periodic threshold curves for the symmetric double-junction SQUID of FIG. 2a. The horizontal axis of these curves is used to plot a quantity proportional to the signal current, and the vertical axis plots a quantity proportional to the gate current applied to the SQUID. The shaded area above the curves represents a condition in which the junction voltage is non-zero, whereas the unshaded area beneath the curves represents the condition in which the junction voltage is zero, which is the desired operating condition for the SQUID quantizer. The designations $k=0$, 1, 2, represent adjacent flux quanta, and the broken line 30 is the trace of a typical set of transitions from one quantum condition to another. For increasing current, from left to right along the line 30, there is a quantum transition at point 32, from $k=0$ to $k=1$, and then again at point 34, from $k=1$ to $k=2$, and yet again at point 36, from $k=2$ to $k=3$. For decreasing current, the transitions would occur at points 38, 40 and 42. The curves provide another way of depicting the nonlinear magnetic flux characteristic of the quantizer, and are directly comparable with the curve shown in FIG. 1.

Figure 3:
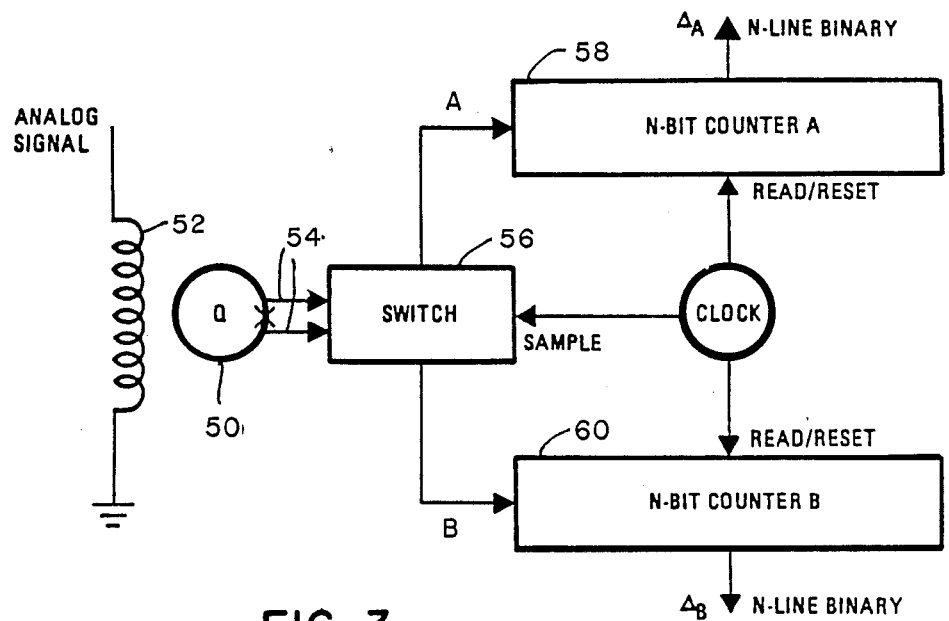
FIG. 3 is a simplified schematic diagram of a superconducting A/D converter employing two bidirectional counters.

FIG. 3 is a simplified block diagram of an A/D converter using these principles. It comprises a double-junction SQUID quantizer 50 to which an analog input signal is applied through a transformer winding 52, the quantizer supplying up-count and down-count pulses on its output lines 54. These are transmitted through a clock-controlled switch 56 to two N-bit bidirectional counters 58 and 60. The reason for including dual counters has to do with a limitation of present-day technology that requires a SQUID counter to be temporarily disabled while its contents are read out. To avoid the possibility of missed pulses, the two counters are alternated such that one is available to record pulses while the other is being sampled. As will be appreciated, the invention to be described is not limited to this dual-counter configuration.

As discussed earlier, there is an inherent limit to the sampling rate of the device imposed by the single flux quantum (SFQ) response time of the quantizer and binary counter. If the desired sampling rate requires an unattainable SFQ response time, the higher sampling rate can be obtained only at the expense of lowering the resolution of the quantizer, and counting fewer quanta of flux for a given change in signal current.

In accordance with the invention, this limitation can be overcome, and A/D conversion can be effected either at a higher sampling rate than was possible without the invention, or at the same sampling rate and increased sensitivity and resolution. The technique employed may be considered analogous to a combination of the counting type of converter and the fully parallel flash type of converter. A more descriptive name for the technique is the interleaved vernier A/D converter.

Figure 4:
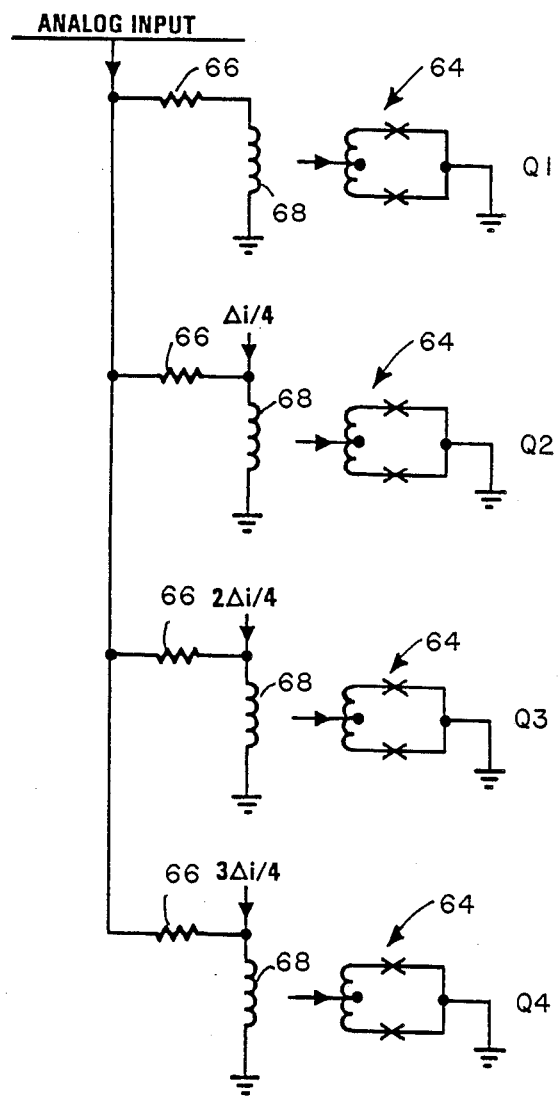
FIG. 4 is a schematic diagram of a two-bit vernier circuit for use in a superconducting A/D converter.

FIG. 4 shows one possible realization of a two-bit interleaved vernier. Instead of one SQUID quantizer there are four such quantizers 64, each supplied with an analog input signal through a parallel set of resistors 66 and inductive windings 68. That is to say, the analog input current is split into four parallel paths, each of which passes through a resistor 66 and an inductive winding 68 to ground. Each quantizer 64 therefore receives an input analog current of $I_C/4$. In addition, three of the four quantizers 64 are biased from their normal quantization level by bias currents shown as injected into the inductive windings 68. Alternatively, the bias currents could be introduced through separate coupling coils. In any event, each quantizer 64 is biased by a different current. The top one in the diagram is unbiased. The second one has a bias current of $\Delta i/4$, where $\Delta i$ is the quantizer current quantum needed to produce an output pulse from the SQUID quantizer. The third quantizer has a bias current of $2\Delta i/4$, and the fourth quantizer has a bias current of $3\Delta i/4$.

Figure 5:
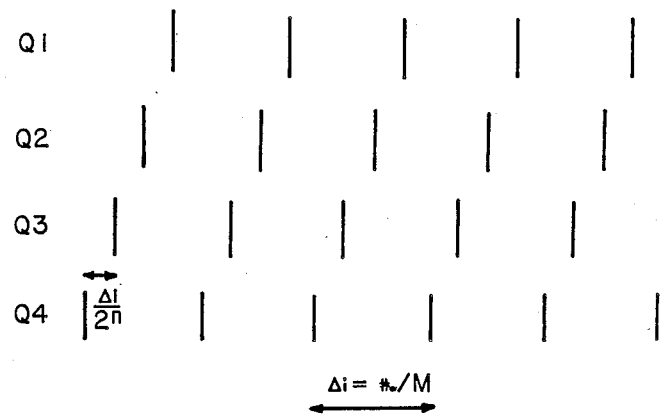
FIG. 5 is a diagrammatic representation showing the staggered quantization levels of four quantizers employed in the vernier circuit of FIG. 4.

FIG. 5 shows diagrammatically how the quantization levels of the four quantizers 64 (FIG. 4) are staggered by the effect of the different bias currents applied to each. Each quantizer still has a quantization level of Δi, but the effect of the bias currents is to permit interpolation between two adjacent levels, to obtain two additional bits of resolution or to allow a faster sampling rate.

Since each of the quantizers 64 receives only one-fourth of the analog signal current, each quantizer generates fewer quantum pulses, by a factor of four. Therefore, the sampling rate of the A/D converter can be increased without running into the inherent limit of the SFQ time response, or at least without running into this limit so soon. Alternatively, the number of bits of resolution of the converter can be increased.

The digital output from an A/D converter using the vernier of FIG. 4 can be obtained by simply counting the pulses from each of the quantizers 64 separately, and then adding them together to obtain the total count. An alternative is to accumulate the count from just one of the quantizers 64, and to "interpolate" between counts by logically combining and decoding the states of all four quantizers, to obtain two least-significant bits (LSB) of output. This is shown diagrammatically in FIG. 6.

Figures 6, 7:
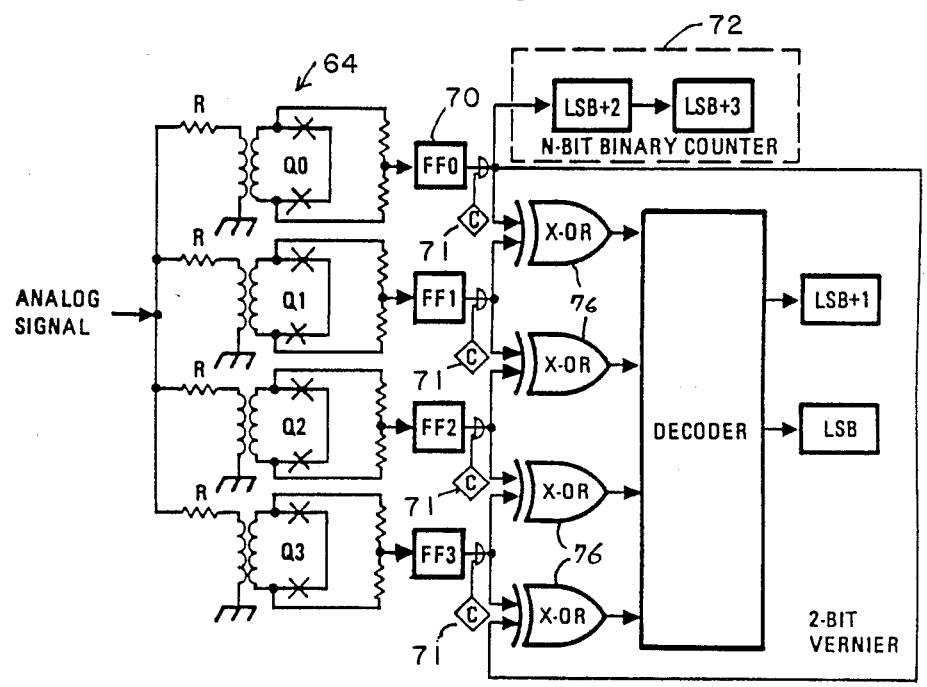
FIG. 6 is a simplified schematic diagram of a two-bit vernier circuit integrated into an (N+2)-bit A/D converter.
FIG. 7 is a diagrammatical representation showing the staggered quantization levels and quantizer binary states for various signal levels applied to the vernier circuit of FIG. 6.

In FIG. 6, the four quantizers 64 are supplied with a one-fourth analog input signal, as in FIG. 4. The outputs of the quantizers, indicated as Q0, Q1, Q2, and Q3, are coupled to four corresponding flip-flop circuits 70, the purpose of which is to register a quantum output signal as a binary state (1 or 0). Each flip-flop, which is also implemented in the form of a SQUID device, changes state between 0 and 1 when toggled by a quantum output signal from its quantizer. In effect, the flip-flops act as divide-by-two circuits, producing a logical "1" condition for every two input pulses. The states of the flip-flops 70 are shown in FIG. 7, in relation to an input signal shown in binary form. Each quantizer binary state changes from 0 to 1 or vice versa as its quantization current is reached, but the effect of the bias currents is to stagger the quantization points for the four devices. All four flip-flops 70 are sampled by clocking signals, indicated at 71.

The state of the first flip-flop (FF0) is connected to an N-bit counter 72, of which only the first two stages are shown. This counter records the quantization level changes of the first quantizer Q0, as indicated at the left-hand set of levels in FIG. 7. The states of all four flip-flops 70 provide a unique indication of the input current level interpolated between the quantization levels of Q0. The remaining circuitry in FIG. 6 decodes the states of the four flip-flops and derives a corresponding two-bit output, which corresponds to the two least significant bits of the output count. One simple way to achieve this decoding is with a set of four exclusive OR (XOR) gates 76. The first XOR gate combines the outputs of FF0 and FF1, the second XOR gate combines the outputs of FF1 and FF2, the third XOR gate combines the outputs of FF2 and FF3, and the fourth XOR gate combines the outputs of FF3 and FF0.

The manner in which the XOR gates 76 operate to generate a four-bit quantity that uniquely defines the two least significant bits of quantization, can best be appreciated from FIG. 7. If the binary states of the four flip-flops 70 are initially all zero, as indicated at the bottom of the figure, and the current is considered to gradually increase, the successive binary states and the corresponding XOR gate outputs are given by the following table:

| Q0 | Q1 | Q2 | Q3 | XOR 0,1 | XOR 1,2 | XOR 2,3 | XOR 3,0 |
|---|---|---|---|---|---|---|---|
| 0 | 0 | 0 | 0 | 0 | 0 | 0 | 0 |
| 0 | 1 | 0 | 0 | 1 | 1 | 0 | 0 |
| 0 | 1 | 1 | 0 | 1 | 0 | 1 | 0 |
| 0 | 1 | 1 | 1 | 1 | 0 | 0 | 1 |
| 1 | 1 | 1 | 1 | 0 | 0 | 0 | 0 |
| 1 | 0 | 1 | 1 | 1 | 1 | 0 | 0 |
| 1 | 0 | 0 | 1 | 1 | 0 | 1 | 0 |
| 1 | 0 | 0 | 0 | 1 | 0 | 0 | 1 |

Figure 8:
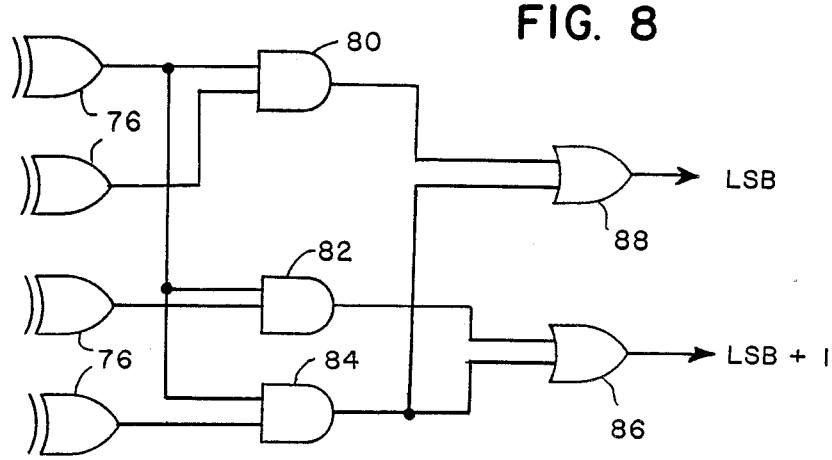
FIG. 8 is a logic diagram illustrating one possible implementation of the decoder of FIG. 6.

It will be noticed that outputs of the XOR gates 76 cycle through four unique combinations of states twice during the eight different combinations of flip-flop conditions. These four XOR gate output conditions can be simply decoded, in decoder 78, to produce the two least significant bits of output in the sequence 00, 01, 10, 11. This decoder logic can take any conventional form, such as AND and OR gates. For example, the logic could take the form shown in FIG. 8, including three AND gates 80, 82 and 84, and two OR gates 86 and 88. AND gate 80 receives as inputs the output of the first and second XOR gates 76, AND gate 82 receives the outputs of the first and third XOR gates, and AND gate 84 receives the outputs of the first and fourth XOR gates. AND gates 80 and 84 have their outputs connected to OR gate 88, to provide the least significant bit of output. AND gates 82 and 84 have their outputs connected to OR gate 86, to provide the next most significant bit of output.

Figure 9:
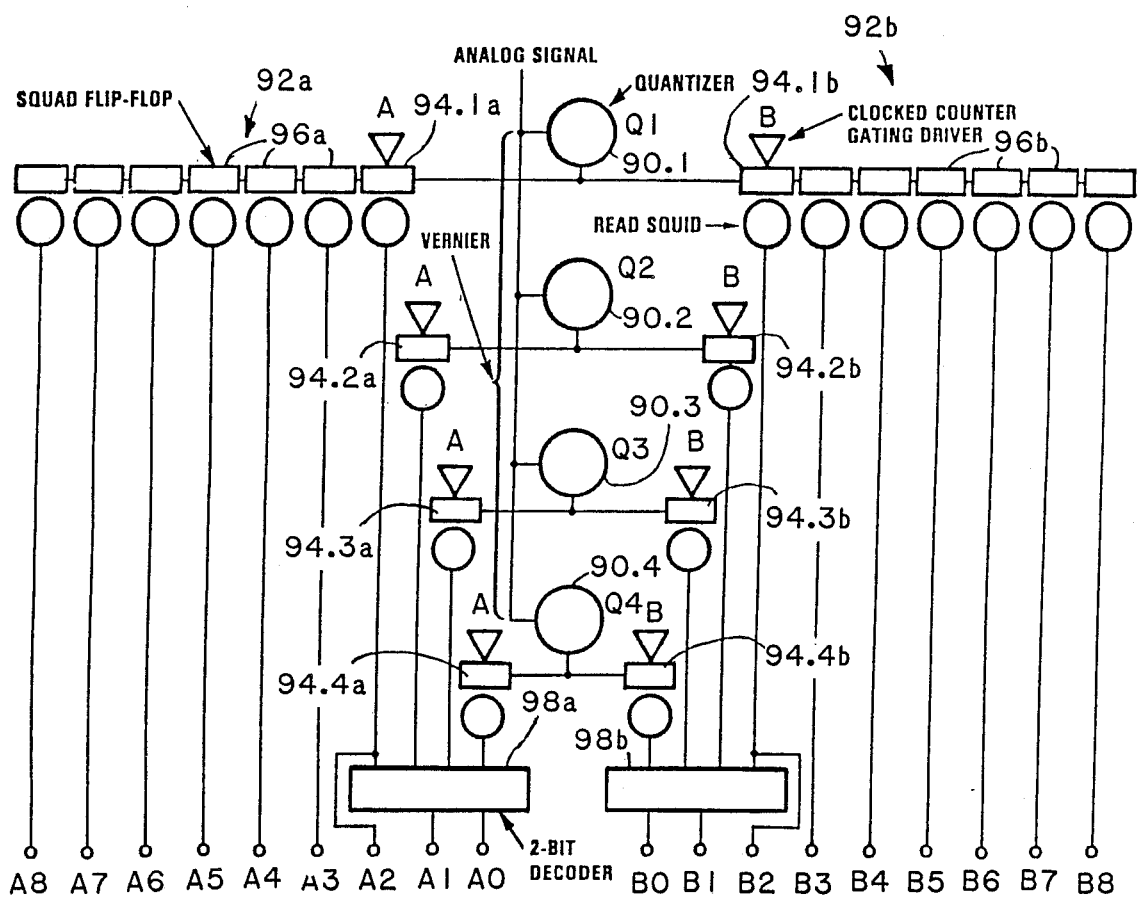
FIG. 9 is a schematic diagram of a complete nine-bit superconducting A/D converter designed to run at approximately 1Gsps.

FIG. 9 shows a complete 9-bit incremental A/D converter with a 2-bit vernier interleaver in accordance with the invention. The converter includes four SQUID quantizers 90.1, 90.2, 90.3 and 90.4 and two bidirectional counters 92a and 92b. Each of the quantizers 90 provides output pulses to two flip-flops 94, designated by the additional numeral 0.1, 0.2, 0.3 or 0.4, and by the alphabetic suffix a or b to indicate which of the counters it is associated with. Thus quantizer 90.1 outputs pulses to flip-flops 94.1a and 94.1b, and so forth. The uppermost flip-flop 94.1a is the first of a string of flip-flops 96a constituting counter 92a, and flip-flop 94.2b is the first of a string of flip-flops 96b constituting counter 92b. Each flip-flop in the converter has a corresponding readout SQUID, indicated by the unnumbered circle adjacent to each flip-flop. Flip-flops 94.1a–94.4a are read out into a two-bit decoder 98a, and flip-flops 94.1b–94.4b are read out into a two-bit decoder 98b. The decoders 98a and 98b each provide a two-bit decoded output, indicated at A0, A1 and B0, B1. The more significant bits of the output are derived from the other flip-flops. Bits A2 through A8 are derived from flip-flop 94.1a and flip-flops 96a, while bits B2 through B8 are derived from flip-flop 94.1b and flip-flops 96b.

The vernier interleaver of the FIG. 9 circuit operates as described with reference to FIG. 6, except that there are two binary counters 92 instead of the one disclosed in FIG. 6. As previously mentioned, two counters may be needed to speed up operations on the flip-flops, if they cannot be unloaded fast enough to permit the use of only one set of flip-flops. In the complete converter of FIG. 9, the digital conversion result is obtained by adding the two sets of outputs A0–A8 and B0–B8.

It will be understood that the disclosure of a two-bit vernier in this specification is merely illustrative of the principles of the invention. In general, an n-bit vernier would require the use of $2^n$ quantizers, and would provide an (N+n)-bit output from the converter. The vernier opens up two options to the converter user. One is to increase the sampling rate, by a factor of up to four. Since each quantizer is receiving one-fourth the analog signal and is generating one-fourth the number of pulses, the quantizer can handle an increased signal bandwidth and a higher sampling rate without degradation due to missed pulses. Alternatively, if the full analog signal current is applied to each quantizer and the sampling rate is not changed, two additional bits of resolution are provided by the vernier.

In another configuration of the vernier, the quantizers are connected such that the analog signal current is applied to all of them in series, instead of being divided equally in parallel. Without the presence of any component to scale the current down, this would result in a digital output with two (or n) additional bits of sensitivity than was the case with only a single quantizer exposed to the same analog current signal. The parallel connection of the quantizers is a convenient way dividing the analog current into four equal portions. Other possibilities include the use of 3dB couplers, resistive networks, and so forth.

It will be appreciated from the foregoing that the present invention represents a significant advance in the field of high-performance A/D converters using superconducting SQUID's. In particular, the invention provides a technique for overcoming the inherent limitation on the sampling rate and resolution of such devices, imposed by the SFQ response time of the quantizer. It will also be appreciated that, although an embodiment of the invention has been described in detail for purposes of illustration, various modifications may be made without departing from the spirit and scope of the invention. Accordingly, the invention is not to be limited except as by the appended claims.

I claim:

1. A superconducting analog-to-digital converter, comprising:
    a plurality of quantizers in the form of superconducting quantum interference devices (SQUID's), configured to generate voltage pulses at periodically spaced quantization levels of analog signal current applied to the quantizers;
    means for applying an approximately identical analog signal current to each of the plurality of quantizers;
    means for applying a different bias current to each of the plurality of quantizers, such that the quantization levels are offset from each other in a uniform manner to provide for interpolation between adjacent quantization levels of a single quantizer, wherein the differently biased quantizers provide a set of quantization levels interleaved between any two adjacent quantization levels of a single quantizer; and
    means for monitoring the voltage pulses output by the quantizers to determine the digital equivalents of changes in the analog signal current.

2. A superconducting analog-to-digital converter as defined in claim 1, wherein:
    the means for monitoring the voltage pulses includes at least one binary counter.

3. A superconducting analog-to-digital converter as defined in claim 1, wherein the number of quantizers is $2^n$, where n is a positive integer, and the means for monitoring the voltage pulses includes:
    an N-bit binary counter for counting pulses from one of the quantizers; and
    decoding means coupled to receive inputs from the quantizers, to generate n-bit output signals indicative of the analog signal current level in relation to the biased quantization levels of the plurality of quantizers, wherein the converter provides an (N+n)-bit digital output equivalent to the accumulated change in the analog input signal.

4. A superconducting analog-to-digital converter as defined in claim 3, wherein:
    each of the quantizers has an associated divide-by-two circuit to provide an indication of a binary state of the quantizer;
    the converter includes clocking means to control reading of binary signals from the divide-by-two circuits.

5. A superconducting analog-to-digital converter as defined in claim 4, wherein:
    the decoding means includes a plurality of exclusive OR gates coupled to receive as inputs the states of the divide-by-two circuits associated with the quantizers, and to provide $2^2$ outputs that uniquely identify which of $2^n$ states are represented by the binary quantization states of the quantizers.

6. A superconducting analog-to-digital converter as defined in claim 5, wherein:
    the decoding means further includes logic means for converting the $2^n$ outputs of the exclusive OR gates to an n-bit binary output signal.

7. A superconducting analog-to-digital converter, comprising:
    a plurality of ($2^n$) of quantizers in the form of superconducting quantum interference devices (SQUID's), where n is a positive integer, configured to generate voltage pulses at periodically spaced quantization levels of an analog signal current applied to the quantizers, adjacent current quantization levels being separated by a uniform current quantum of $\Delta i$, where $\Delta i$ is the change in analog signal current between adjacent quantization levels associated with any one of the quantizers;
    means for supplying substantially equal analog signal currents to the plurality of quantizers;
    means for applying a different bias current to each of the plurality of quantizers, such that the quantization levels are offset from each other in a uniform manner to provide for interpolation between adjacent quantization levels of a single quantizer, the quantizer bias currents having respective values of 0, $\Delta i/2^n$, $2\Delta i/2^n$, and so forth up to $(2^{n-1})\Delta i/2^n$; and
    means for monitoring the voltage pulses output by the quantizers to determine the digital equivalents of changes in the analog signal current, to obtain a set of quantization levels interleaved between normally spaced quantization levels thereby permitting increased resolution or an increased sampling rate from the converter.

8. A superconducting analog-to-digital converter as defined in claim 7, wherein:
    the means for supplying substantially equal analog signal currents includes means for dividing a total analog signal current into $2^n$ approximately equal portions and applying the portions one to each of the quantizers.

9. A superconducting analog-to-digital converter as defined in claim 7, wherein:
   the means for supplying substantially equal analog signal currents functions to supply a single analog input current signal to each and all of the plurality of quantizers.

10. A superconducting analog-to-digital converter as defined in claim 7, wherein the means for monitoring the voltage pulses includes:
   an N-bit binary counter for counting pulses from one of the quantizers; and
   decoding means coupled to receive inputs from the quantizers, to generate n-bit output signals indicative of the analog signal current level in relation to the biased quantization levels of the plurality of quantizers, wherein the converter provides an (N+n)-bit digital output equivalent to the accumulated change in the analog input signal.

11. A superconducting analog-to-digital converter as defined in claim 10, wherein:
   each of the quantizers has an associated flip-flop circuit to provide an indication of a binary state of the quantizers; and
   the converter includes clocking means to control reading of binary signals from the flip-flop circuits.

12. A superconducting analog-to-digital converter as defined in claim 11, wherein:
   the decoding means includes a plurality of exclusive OR gates coupled to receive as inputs the states of the flip-flop circuits associated with the quantizers, and to provide $2^n$ outputs that uniquely identify which of $2^n$ states are represented by the binary quantization states of the quantizers.

13. A superconducting analog-to-digital converter as defined in claim 12, wherein:
   the decoding means further includes logic means for converting the $2^n$ outputs of the exclusive OR gates to an n-bit binary output signal.

14. A superconducting analog-to-digital converter as defined in claim 11, and further comprising:
   a second bidirectional binary counter; and
   a second decoding means;
   a second set of flip-flop circuits associated with the quantizers;
   wherein the outputs of the quantizers are coupled to both counters and to both decoding means, through the respective sets of flip-flop circuits, to ensure that the outputs of the quantizers are still being recorded when the contents of one counter and one set of flip-flop circuits are being read for output.

* * * * *